(12) United States Patent
Ciobanu et al.

(10) Patent No.: US 10,080,271 B2
(45) Date of Patent: Sep. 18, 2018

(54) LED CONTINUOUS CONSTANT IRRADIANCE WITH TEMPERATURE VARIATION

(71) Applicant: Rosemount Inc., Shakopee, MN (US)

(72) Inventors: Calin Ciobanu, Brea, CA (US); Jeffrey Lawrence Lomibao, Corona, CA (US)

(73) Assignee: Rosemount Inc., Shakopee, MN (US)

( * ) Notice: Subject to any disclaimer, the term of this patent is extended or adjusted under 35 U.S.C. 154(b) by 0 days.

(21) Appl. No.: 15/277,710

(22) Filed: Sep. 27, 2016

(65) Prior Publication Data

US 2017/0245345 A1 Aug. 24, 2017

Related U.S. Application Data

(60) Provisional application No. 62/296,776, filed on Feb. 18, 2016.

(51) Int. Cl.
*H05B 37/02* (2006.01)
*G01K 11/16* (2006.01)
*H01L 33/64* (2010.01)
*H05B 33/08* (2006.01)

(52) U.S. Cl.
CPC ......... *H05B 37/0227* (2013.01); *G01K 11/16* (2013.01); *H01L 33/645* (2013.01); *H05B 33/0854* (2013.01)

(58) Field of Classification Search
CPC ............ H05B 33/0833; H05B 33/0854; H05B 33/0872; H05B 33/0875
See application file for complete search history.

(56) References Cited

U.S. PATENT DOCUMENTS

| | | | |
|---|---|---|---|
| 8,110,995 B2* | 2/2012 | Deurenberg | H05B 33/0818 315/149 |
| 9,769,909 B2* | 9/2017 | Gershowitz | H05B 37/0272 |
| 2006/0022616 A1 | 2/2006 | Furukawa | |
| 2007/0115228 A1* | 5/2007 | Roberts | G09G 3/3413 345/82 |
| 2007/0216704 A1* | 9/2007 | Roberts | G09G 3/3426 345/597 |
| 2012/0104953 A1* | 5/2012 | Chobot | H05B 33/0872 315/153 |
| 2012/0319592 A1* | 12/2012 | Riesebosch | H05B 33/0851 315/152 |
| 2015/0099304 A1 | 4/2015 | Butcher | |

(Continued)

FOREIGN PATENT DOCUMENTS

JP 2008-513736 A 5/2008

OTHER PUBLICATIONS

"Body Power LED Driving Concepts". Infineon, Application Note V1.1, dated Jun. 29, 2011, 18 pages.

(Continued)

*Primary Examiner* — Jason M Crawford
(74) *Attorney, Agent, or Firm* — Christopher R. Christenson; Kelly, Holt & Christenson, PLLC (57) ABSTRACT

A temperature-stabilized LED irradiance system is provided. The system includes an LED. A temperature sensor is disposed to sense a temperature proximate the LED. Circuitry coupled to the temperature sensor and the LED, is configured to adjust power to the LED based on the sensed temperature.

18 Claims, 6 Drawing Sheets

(56) References Cited

U.S. PATENT DOCUMENTS

2015/0296589 A1* 10/2015 Melanson .......... H05B 33/0821
                                                         315/151

OTHER PUBLICATIONS

International Search Report and Written Opinion for International Patent Application No. PCT/US2017/014500, dated Apr. 27, 2017, 14 pages.
First Office Action, dated Apr. 3, 2018, for Chlriese Patent Application No. 201710048781.5, 14 pages including English translation.

* cited by examiner

LED CONTINUOUS CONSTANT IRRADIANCE WITH TEMPERATURE VARIATION

CROSS-REFERENCE TO RELATED APPLICATIONS

The present application is based on and claims the benefit of U.S. Provisional Patent Application Ser. No. 62/296,776 filed Feb. 18, 2016, the content of which is hereby incorporated by reference in its entirety.

BACKGROUND

Online wet chemistry analyzers are used in a variety of industries to provide a continuous indication of an analyte in a process sample. This continuous indication can be provided locally by the analyzer and/or remotely to one or more suitable devices in order to provide control and/or monitoring of a chemical process.

One particular type of online wet chemistry analyzer is an online silica analyzer. These devices are configured to generate a reaction in the process sample that allows an indication of silica in the sample to be determined. Such analyzers are useful in determining silica content in boiler water, boiler feedwater, demineralized water, and steam condensate. While such analyzers are useful in a variety of industries, they are of particular use in power plant boilers. In such systems, silica can form silicate deposits that can damage turbines and other generation equipment that is used in the water-steam turbine cycle. Accordingly, power plants with high pressure turbines generally monitor silica carefully in order to ensure effective detection and removal/remediation. One particular example of an online silica analyzer is sold under the trade designation Model CFA3030 Silica Analyzer from Rosemount Analytical, an Emerson Automation Solutions company.

An online silica analyzer will generally employ a known reaction to render the silica in the process sample readily detectable. One example of such a reaction is known as the molybdenum blue method. In the molybdenum blue method, molybdate (usually in the form of potassium molybdate) is used to react with silica in the process sample/solution in order to generate a compound suitable for colorimetric detection. In accordance with the molybdenum blue method, the silica content in water is measured based on the color of the silicomolybdic acid formed through the wet chemistry process.

SUMMARY

A temperature-stabilized LED irradiance system is provided. The system includes an LED. A temperature sensor is disposed to sense a temperature proximate the LED. Circuitry coupled to the temperature sensor and the LED, is configured to adjust power to the LED based on the sensed temperature.

These and various other features and advantages that characterize the claimed embodiments will become apparent upon reading the following detailed description and upon reviewing the associated drawings.

DETAILED DESCRIPTION OF ILLUSTRATIVE EMBODIMENTS

The present disclosure relates to a light emitting diode (LED) that maintains a constant irradiance during temperature variations. A variety of colorimetric wet chemistry analyzers employ LEDs in order to generate the light required for colorimetric measurements. LED's utilize electron flow across a p-n junction to generate light. When driven at a constant current, the irradiance of an LED is a function of the temperature of the environment of the LED, i.e., the temperature of the LED substrate (die). This is especially so as the LED emits light closer to the infra-red light (IR) spectrum. In many situations, these temperature-based variations in the irradiance may be acceptable to a user of the LED. However, in some applications, such as colorimetric analyzers, such variations can cause measurement errors.

When an LED is used as the light source for a colorimetric analyzer, the light intensity of the light source changes with the temperature of the environment where the analyzer is placed. The light absorbance A, is set forth in Equation 1, below:

$$A = -\log 10(I/I^0) \quad \text{Equation 1}$$

Where I is the measured light intensity when color has been developed after reactions, and $I^0$ is the measured light intensity before the color is developed. During operation of the wet chemistry analyzer, these two measurements of light intensity occur at different times. If the ambient temperature changes during the process and if the LED is driven at a constant electric current, the calculation of the measured $(I/I^0)$ will include an error caused by the irradiance dependency on temperature.

Figure 1:
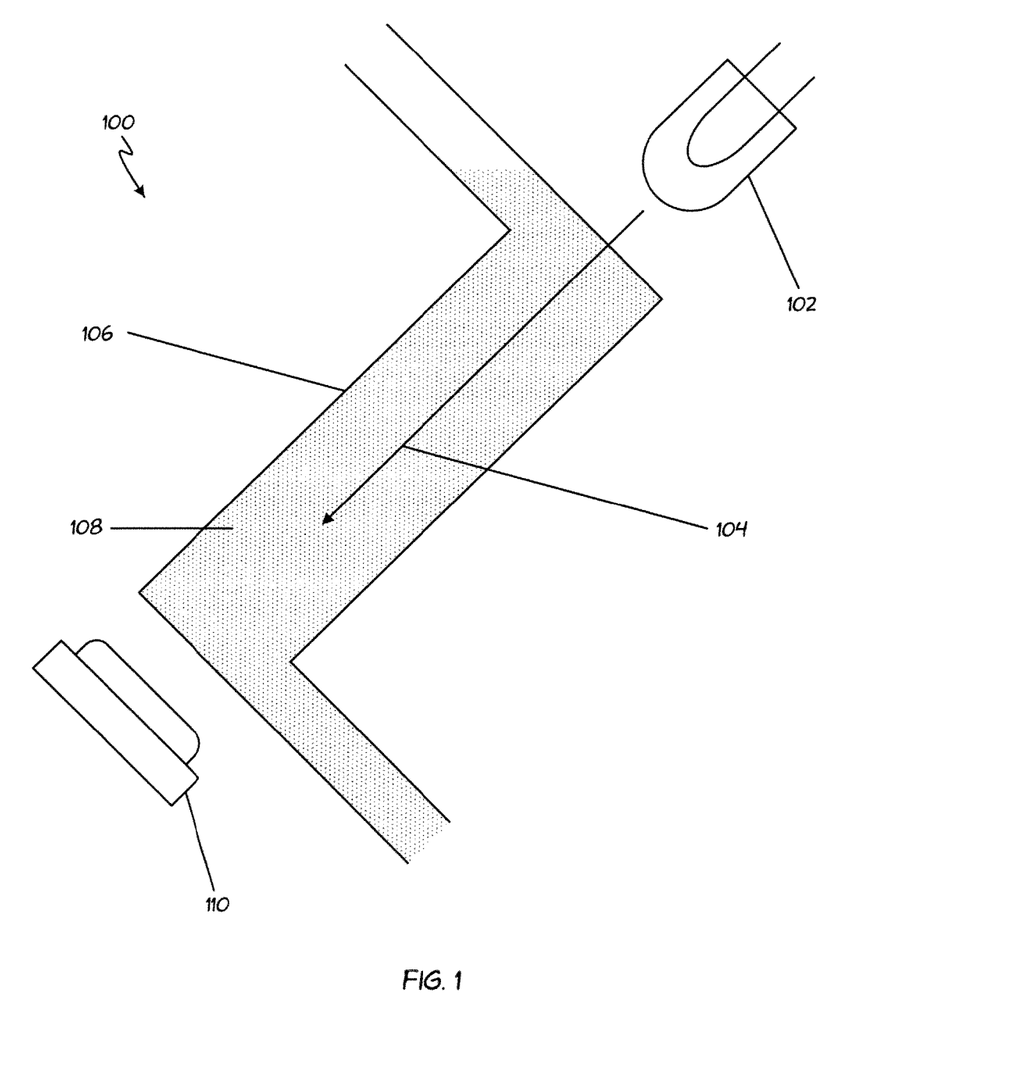
FIG. 1 illustrates a portion of a colorimetric analyzer in accordance with an embodiment of the present invention.

FIG. 1 illustrates a portion of a colorimetric analyzer in accordance with an embodiment of the present invention. Colorimeter analyzer 100 may be useful to analyze a liquid 108 located in photometric cell 106 by passing an illumination 104 through liquid 108. LED 102 generates illumination 104 which passes through liquid 108 and is detected by a photo sensor 110. Photo sensor 110 may be any sensor that detects a characteristic of light, including, but not limited to, a colorimeter, spectroradiometer, spectrophotometer, or densitometer.

Figure 2A:
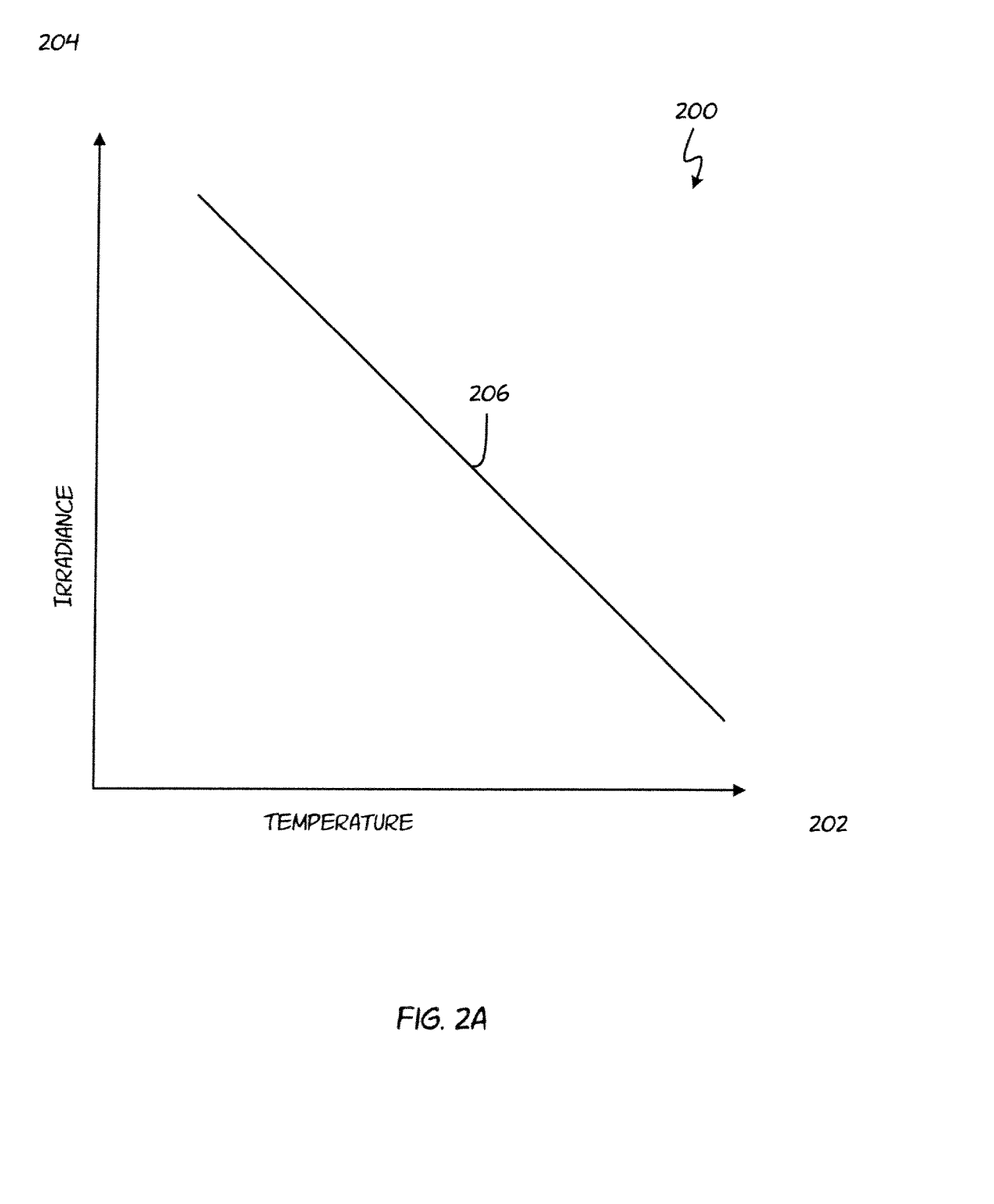
FIG. 2A is a chart illustrating irradiance versus temperature in accordance with an embodiment of the present invention.

In order for multiple measurements taken by colorimeter analyzer 100 to be compared, illumination 104 must be consistent. If there is variation in illumination 104 between measurements, the variation must be adjusted for or the comparison between measurements will be inaccurate. A problem with LED's is illustrated in FIG. 2A. Chart 200 has an X-axis 202 representing temperature and Y-axis 204 representing irradiance. Trend line 206 illustrates how as temperature of an LED increases, the irradiance of the LED decreases.

One solution to this problem would be to, if temperature changes, drain liquid 108 from photometric cell 106 and measure un-obstructed illumination 104, as a control value. Then, while maintaining the temperature, refill photometric cell 106 with liquid 108 and project illumination 104 through liquid 108 and measure an experimental value. The experimental value can then be adjusted by the control value. This is a viable solution but comes with the cost of draining-refilling and also increased likelihood of errors during adjusting measured values based on varying illumination 104 values.

Figure 2B:
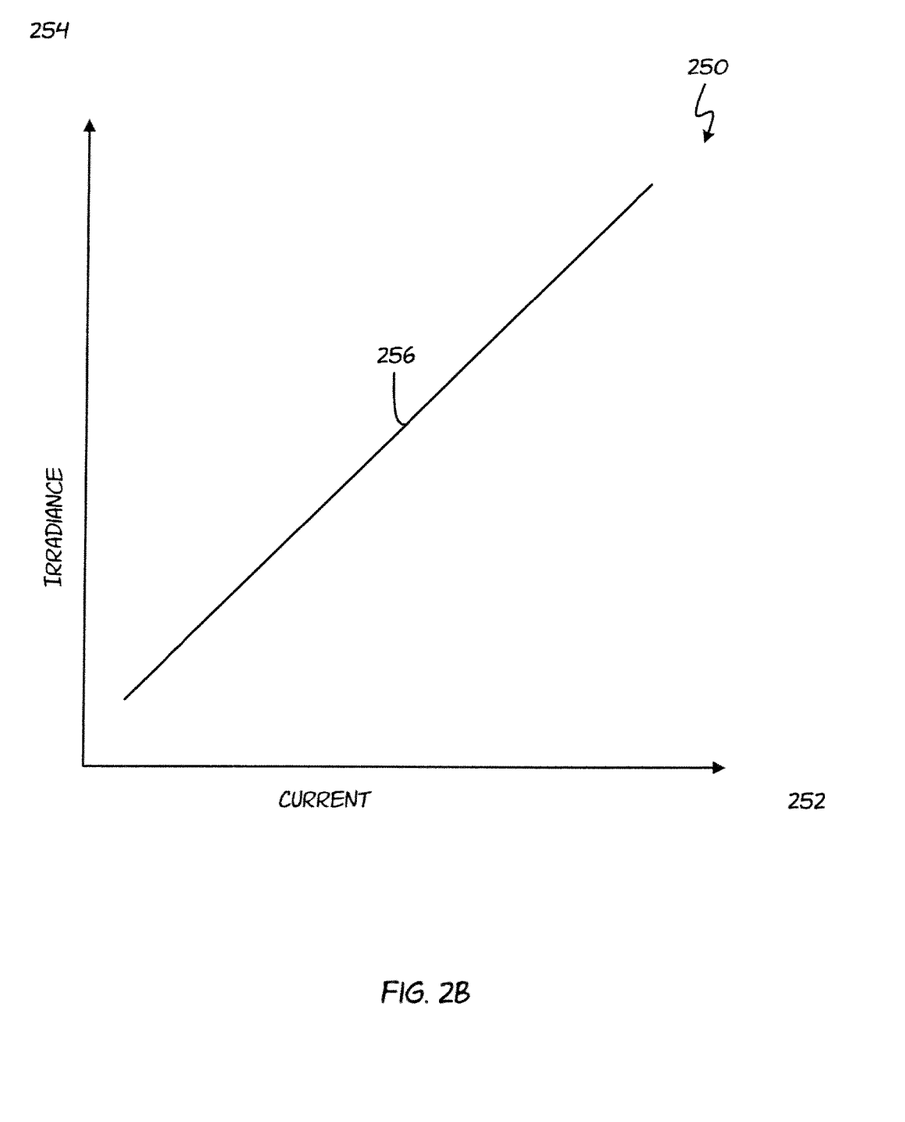
FIG. 2B is a chart illustrating irradiance versus current in accordance with an embodiment of the present invention.

A better solution is to, as temperature changes, ensure that the illumination 104 generated by LED 102 stays constant. Irradiance of an LED is determined by more than just temperature. FIG. 2B is a chart illustrating irradiance versus current in accordance with an embodiment of the present invention. Chart 250 has an X-axis 252 representing current and a Y-axis 254 representing irradiance. Trend line 256 illustrates how as current supplied to an LED increase, the irradiance of the LED increases. In order for an LED to maintain a constant irradiance in a varying temperature environment, it is possible to vary the current supplied to the LED. For example, as temperature increases, current will also have to increase to maintain a constant irradiance.

Figure 3A:
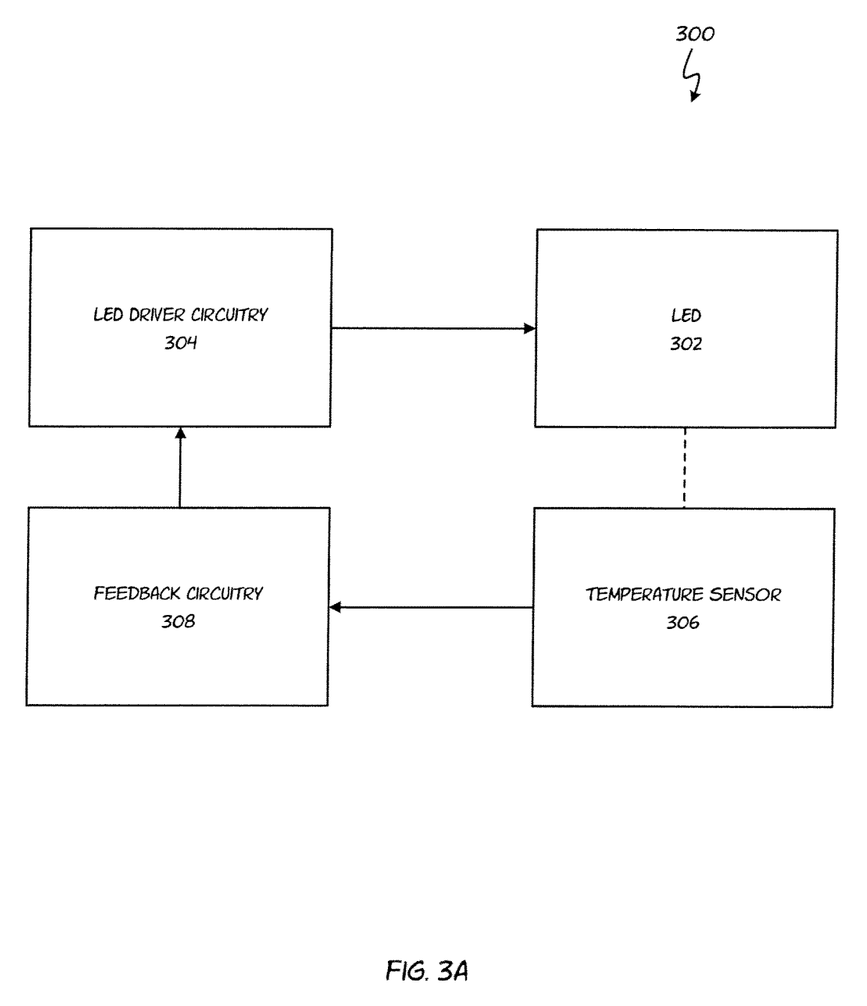
FIGS. 3A-B illustrate a LED circuits in accordance with an embodiment of the present invention.

FIG. 3A illustrates an LED circuit in accordance with an embodiment of the present invention. LED circuit 300 comprises an LED 302, LED driver circuitry 304, feedback circuitry 308 and temperature sensor 306. Temperature sensor 306 is disposed to sense the temperature proximate LED 302. Temperature sensor 306 can be any suitable structure that has an electrical characteristic that varies with temperature. Examples, include a resistance temperature detector (RTD), a thermocouple, a thermistor, etc. Temperature sensor 306, in one embodiment, may be coupled to the LED 302 die/substrate utilizing a heatsink.

Temperature sensor 306 is coupled to feedback circuitry 308, which provides a signal to LED driver circuitry 304. Feedback circuitry 308 and/or driver circuitry 304 can be embodied in any combination of digital or analog circuitry. For example, feedback circuitry 308 could be embodied using a microcontroller having an analog to digital converter that receives a signal from temperature sensor 306 and provides a digital indication of temperature. This digital indication can then be used by LED driver circuitry 304 to compute and adjust the power provided to LED 302, thereby controlling irradiance based on the measured temperature. In one embodiment, LED driver circuitry 304 and feedback circuitry 308 are components of a single circuitry.

Figure 3B:
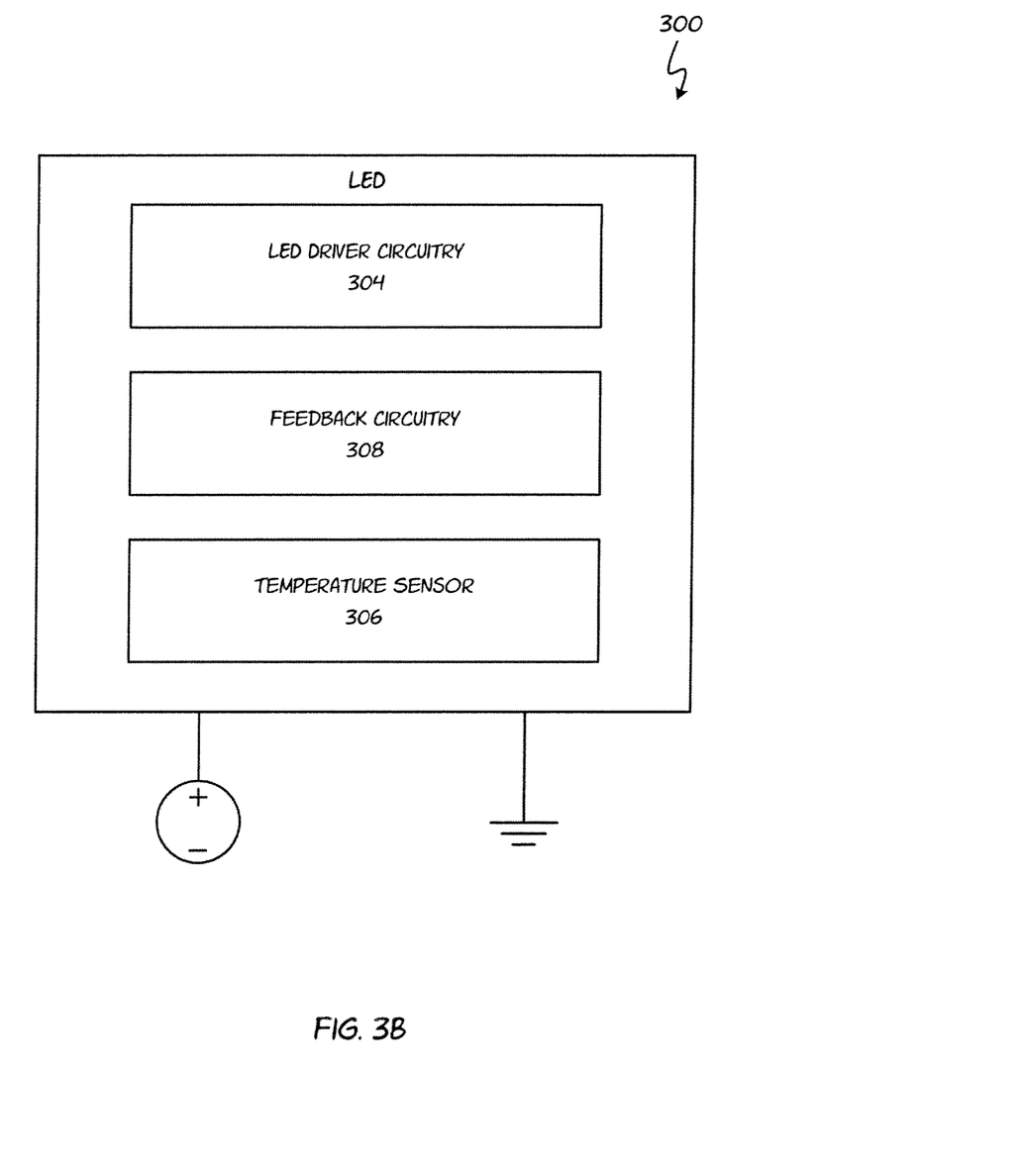

While the embodiment shown in FIG. 3A illustrates temperature sensor 306 separate from LED 302, it is expressly contemplated that embodiments can be practiced where the temperature sensor is a part of LED 302 or disposed within the LED package. FIG. 3B illustrates an embodiment, wherein LED driver circuitry 304, feedback circuitry 308 and temperature sensor 306 are disposed within LED 302. However, any of these components may be separate from LED 302.

Figure 4:
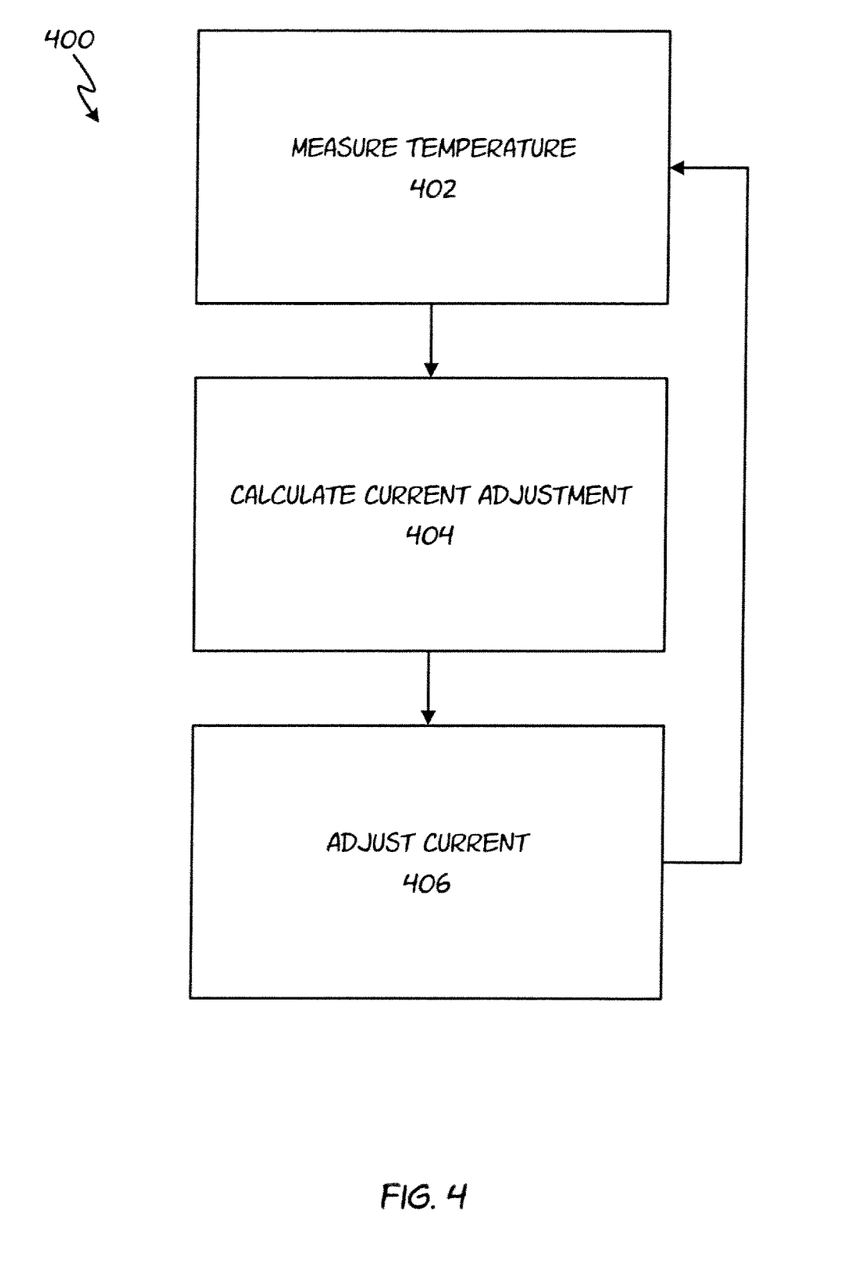
FIG. 4 illustrates a flow diagram of a method for LED control in accordance with an embodiment of the present invention.

FIG. 4 illustrates a flow diagram of a method for LED control in accordance with an embodiment of the present invention. Irradiance stabilization 400 comprises three steps. At block 402, a temperature is measured proximate the LED. In one embodiment, the temperature measurement is taken within the LED.

At block 404, a power adjustment is calculated. The calculation of power adjustment uses the temperature measured in block 402 as an input. The calculation, in one embodiment, includes temperature vs irradiance data from the manufacturer. In another embodiment, the calculation comprises a temp-radiance constant multiplied by the measured temperature.

At block 406, the power to the LED is adjusted utilizing the calculation from block 404. The adjustment may be made can be by circuitry, embodied in any combination of digital and/or analog circuitry. After the power supplied to the LED is adjusted, the cycle may repeat and the power supplied constantly adjusted to compensate for any change in temperature.

Although the present invention has been described with reference to preferred embodiments, workers skilled in the art will recognize that changes may be made in form and detail without departing from the spirit and scope of the invention.

What is claimed is:

1. A temperature-stabilized LED irradiance system for a wet chemistry analyzer comprising:
   an LED;
   a temperature sensor disposed within the LED, disposed to sense a temperature proximate the LEI); and
   circuitry coupled to the temperature sensor and disposed within the LED, wherein the circuitry is configured to calculate a power adjustment based on the sensed temperature, wherein the calculated power adjustment is specific to the LED, and wherein the circuitry is further configured to adjust power to the LED, based on the calculated power adjustment such that a substantially constant irradiance is maintained by the LED.

2. The temperature-stabilized LED irradiance system of claim 1, wherein the LED is an illumination source in a colorimetric analyzer.

3. The temperature-stabilized LED irradiance system of claim 1, wherein the irradiance of the LED is kept constant by continuously controlling the LED power.

4. The temperature-stabilized LED irradiance system of claim 1, wherein power is adjusted by controlling current to the LED.

5. The temperature-stabilized LED irradiance system of claim 1, wherein the circuitry comprises: a digital circuitry component and an analog circuitry component.

6. A light emitting diode (LED) for a wet chemistry analyzer, the LED comprising:
   a temperature sensor, disposed within the LED, the temperature sensor configured to sense a temperature within the LED, wherein the temperature sensor is configured to substantially sense only the temperature of the specific LED;
   feedback circuitry disposed within the LED and coupled to the temperature sensor, the circuitry configured to, based on the sensed temperature, calculate a power adjustment required to maintain an irradiance of the LED; and
   driver circuitry, disposed within the LED, configured to adjust a power provided to the LED based on the calculated power adjustment, wherein the driver circuitry is configured to substantially provide power only to the specific LED.

7. The LED of claim 6, wherein the temperature sensor is heatsinked to a p-n junction of the LED.

8. The LED of claim 6, wherein the temperature sensor comprises a thermocouple.

9. The LED of claim 6, wherein the temperature sensor comprises a resistance temperature detector.

10. The LED of claim 6, wherein the circuitry comprises: a digital circuitry component and an analog circuitry component.

11. The LED of claim 6, wherein an irradiance of the LED is kept constant by continuously adjusting the power provided to the LED.

12. The LED of claim 6, wherein the LED is configured for providing illumination in a wet chemistry analyzer.

13. A method of operating an LED within a wet chemistry analyzer, the method comprising:
- monitoring a temperature signal of a temperature sensor disposed to sense a temperature within the LED, wherein the temperature sensor and the LED comprise an operating pair, and wherein the temperature signal is specific to the LED;
- calculating a power adjustment for the LED based on the temperature signal; and
- adjusting a power provided to the LED based on the calculated power adjustment;
- repeating the steps of monitoring the temperature signal, calculating the power adjustment, and adjusting the power provided at a frequency sufficient to substantially maintain an irradiance level emitted by the LED.

14. The method of claim 13, wherein adjusting comprises adjusting a current provided to the LED.

15. The method of claim 13, wherein the temperature sensor is within the LED.

16. The method of claim 13, wherein the calculating comprises an input indicative of a temperature-irradiance constant specific to the LED.

17. The method of claim 13, wherein the calculating and adjusting are completed by controller circuitry.

18. The method of claim 13, wherein the calculating comprises determining a target power to maintain a given irradiance at the sensed temperature.

* * * * *

UNITED STATES PATENT AND TRADEMARK OFFICE
CERTIFICATE OF CORRECTION

PATENT NO.      : 10,080,271 B2
APPLICATION NO. : 15/277710
DATED           : September 18, 2018
INVENTOR(S)     : Calin Ciobanu and Lawrence Lomibao It is certified that error appears in the above-identified patent and that said Letters Patent is hereby corrected as shown below:

In the Claims

Column 4 Line 21 Claim 1: "LEI)" should be changed to "LED"

Signed and Sealed this
Twenty-fifth Day of June, 2019

Andrei Iancu
*Director of the United States Patent and Trademark Office*